United States Patent
Hsu et al.

(10) Patent No.: US 7,656,183 B2
(45) Date of Patent: Feb. 2, 2010

(54) METHOD TO EXTRACT GATE TO SOURCE/DRAIN AND OVERLAP CAPACITANCES AND TEST KEY STRUCTURE THEREFOR

(75) Inventors: Yu-Hao Hsu, Taipei Hsien (TW); Kuo-Liang Yeh, Hsinchu (TW)

(73) Assignee: United Microelectronics Corp., Hsin-Chu (TW)

( * ) Notice: Subject to any disclaimer, the term of this patent is extended or adjusted under 35 U.S.C. 154(b) by 16 days.

(21) Appl. No.: 12/016,197

(22) Filed: Jan. 17, 2008

(65) Prior Publication Data

US 2009/0184316 A1 Jul. 23, 2009

(51) Int. Cl.
*G01R 31/26* (2006.01)

(52) U.S. Cl. .......................... 324/769; 438/18
(58) Field of Classification Search .............. 324/769; 438/18; 257/48
See application file for complete search history.

(56) References Cited

U.S. PATENT DOCUMENTS

| 5,648,920 | A | 7/1997 | Duvvury et al. |
| 6,069,485 | A | 5/2000 | Long et al. |
| 6,169,302 | B1* | 1/2001 | Long et al. ................. 257/288 |
| 6,214,709 | B1* | 4/2001 | Chen ......................... 438/586 |
| 6,300,657 | B1* | 10/2001 | Bryant et al. ............... 257/318 |
| 2003/0122123 | A1* | 7/2003 | Deng et al. .................. 257/48 |

\* cited by examiner

*Primary Examiner*—Zandra Smith
*Assistant Examiner*—Jamie Niesz
(74) *Attorney, Agent, or Firm*—Winston Hsu

(57) ABSTRACT

A method to extract gate to source/drain and overlap capacitances is disclosed. A first capacitance of a first test key having a reference structure and a second capacitance of a second test key having a novel structure are measured. The second test key may comprise at least a gate formed on an insulation structure, at least a contact formed on the insulation structure aside, and a metal layer formed on the contact. Another embodiment of the second test key may comprise at least a gate formed on the semiconductor substrate, a contact formed aside, and a metal layer formed on the contact. Further another embodiment uses a test key comprising at least an elongated gate and an elongated doping region aside, and only one or a few contacts are formed on an end portion of the elongated doping region.

5 Claims, 5 Drawing Sheets

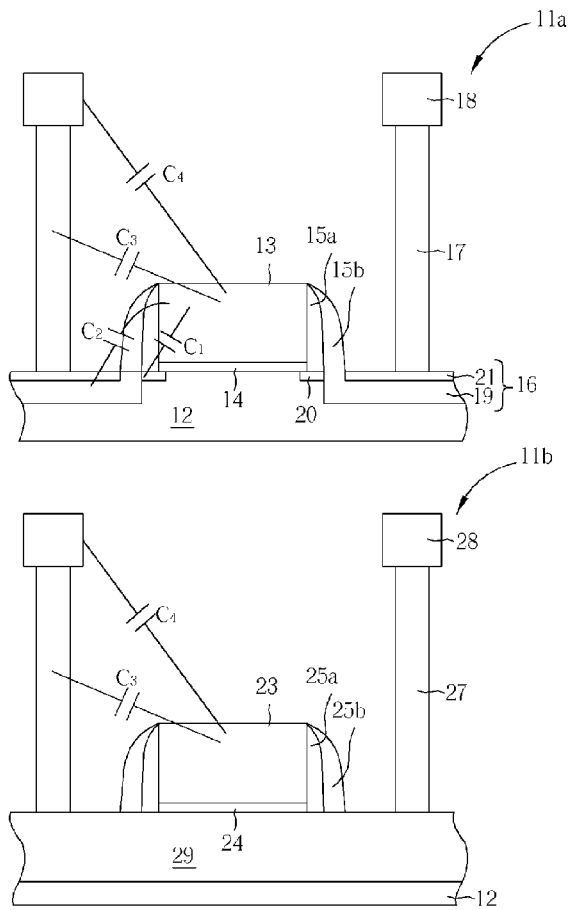
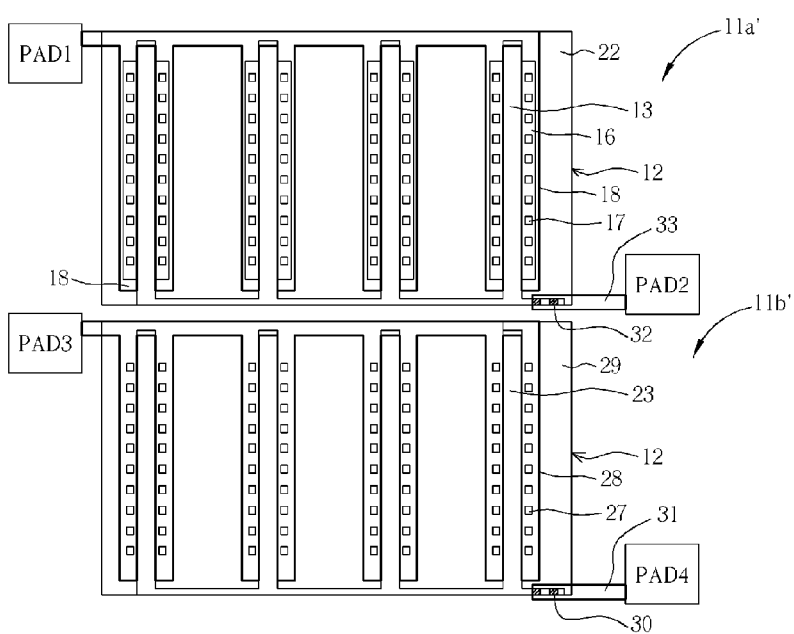
FIG. 3
FIG. 4

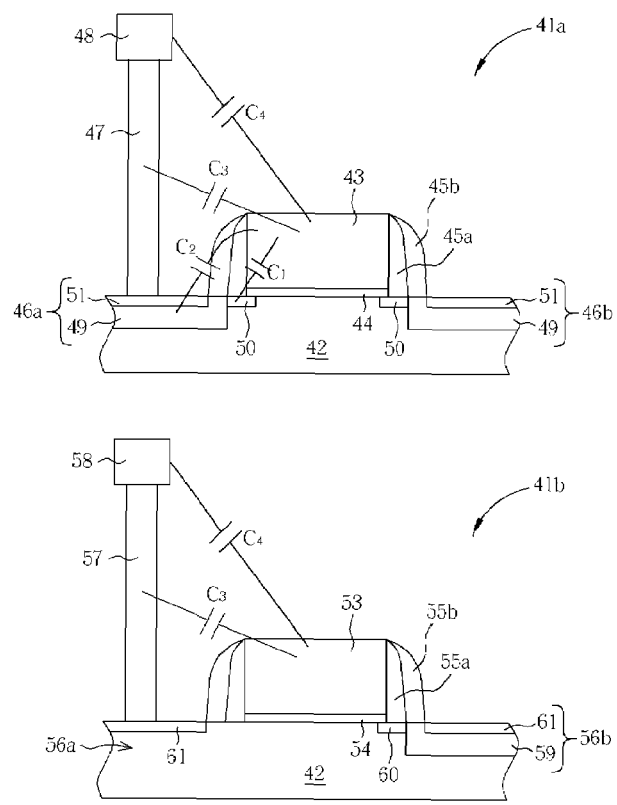
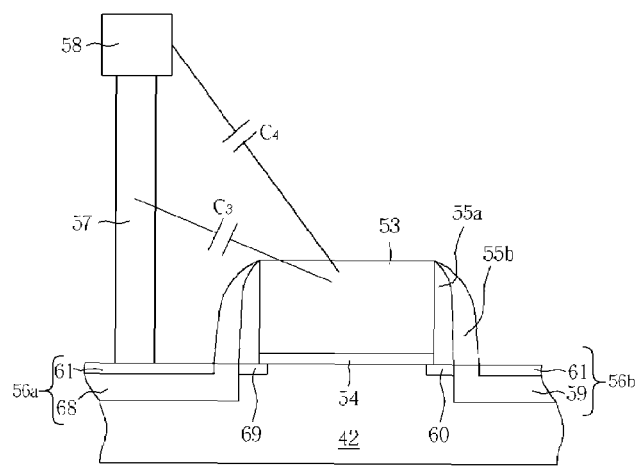
FIG. 6

METHOD TO EXTRACT GATE TO SOURCE/DRAIN AND OVERLAP CAPACITANCES AND TEST KEY STRUCTURE THEREFOR

BACKGROUND OF THE INVENTION

1. Field of the Invention

The present invention relates to decoupling gate to contact and gate to metal capacitances from overall gate capacitance, and particularly to a method to extract gate to source/drain and overlap capacitances and a test key structure used for the method.

2. Description of the Prior Art

In the semiconductor industry there is a continuing trend toward manufacturing integrated circuits (ICs) with higher densities. Accordingly, smaller feature sizes, smaller separations between features and more precise feature shapes are required in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher cost efficiency in IC fabrication by providing more circuits on a die and/or more die per semiconductor wafer.

As device sizes continue to shrink, however, parasitic capacitance effects may become noticeable and/or problematic. There are a number of parasitic capacitances associated with a MOS transistor. For example, ion implantation is utilized to create the source and drain extension regions (LDD regions) in the transistor. A high temperature anneal is subsequently employed to activate the implanted dopants, and some of the dopants can migrate toward gate channel due to lateral diffusion.

The overlap regions in which LDD regions overlap with gate structure can give rise to "overlap capacitances" since the gate structure includes at least a conductive layer overlying at least a dielectric material over a substrate, and the at least a dielectric material, in turn is situated between the gate structure and the diffused conductive dopants in the substrate. The value of the overlap capacitance depends upon the area or degree of overlap between the gate structure and the diffused dopants, among other things. As the size of the gate structure is reduced, the overlap capacitance becomes significant to reduce transistor and IC performance. Accordingly, many test methods are developed for trying to obtain the value of the overlap capacitance. However, as the IC scale is down to 0.13 or 0.09 μm or even beyond that, contact to gate or metal layer to gate capacitances will affect the accuracy of overlap and gate to source/drain capacitances. A cross-sectional view of a conventional MOS transistor is shown in FIG. 1. The MOS transistor 1 includes a gate 3 formed over a semiconductor substrate 2, a gate dielectric layer 4 formed between the semiconductor substrate 2 and the gate 3, composite spacers composed of spacers 5a and 5b formed on both sidewalls of the gate 3, a pair of source/drain 6 formed in the semiconductor substrate on two opposite sides of the gate 3, a pair of source/drain extensions 7 extending under the gate 3 to overlap with the gate 3, a salicide layer 8 on each source/drain 6, a contact 9 formed on each salicide layer 8, and a metal layer 10 formed on the contacts 9. Capacitances exist between the gate and the source/drain ($C_2$), the source/drain extension ($C_1$), the contact ($C_3$), and the metal layer ($C_4$). $C_1$ is overlap capacitance but can not be decoupled from $C_2$ during measurement.

Currently, a TCAD simulation method is employed to predict the capacitance with or without $C_3$ and $C_4$; however the real data is not known.

Conventional test keys are used for attempt on measuring the overlap capacitance; nevertheless, the four items: $C_1$, $C_2$, $C_3$, and $C_4$ are measured inseparably. What usually concerned are $C_1$ and $C_2$, and $C_3$ and $C_4$ are usually neglected. However, as the technology node shrinks down, $C_3$ and $C_4$ become too higher to be neglected. FIG. 10 is a diagram showing a plot of $C_1+C_2+C_3+C_4$ capacitance versus gate-to-source voltage in a conventional test key with a channel width of 10 μm and a channel length of 1.2 μm, wherein $C_2$, $C_3$ and $C_4$ are not functions of $V_{GS}$, i.e. $C_2$, $C_3$ and $C_4$ do not change along with $V_{GS}$, and therefore $C_1$ contributes to the total capacitance change along with $V_{GS}$.

Accordingly, it is a need for developing a novel method to extract $C_1+C_2$ capacitances and a test key structure for the method, to obtain the pure $C_1+C_2$ capacitances.

SUMMARY OF THE INVENTION

One objective of the present invention is to provide a method to extract gate to source/drain and overlap capacitances and a test key structure used for the method, such that the gate to source/drain and overlap capacitances and gate to contact and gate to metal capacitances can be decoupled and the pure gate to source and/or gate to drain and overlap capacitances can be obtained.

The method to extract gate to source/drain and overlap capacitances of the present invention comprises steps as follows. First, a first test key and a second test key are provided. The first test key comprises at least a first gate formed on a semiconductor substrate, at least a first gate dielectric layer formed between the semiconductor substrate and the first gate, a first spacer formed on a sidewall of the first gate, a first doping region formed in the semiconductor substrate on a side of the first gate, at least a first contact formed on the first doping region, and a first metal layer formed on the first contact. The second test key comprises at least a second gate formed on an insulation structure in the semiconductor substrate, at least a second gate dielectric layer formed between the insulation structure and the second gate, a second spacer formed on a sidewall of the second gate, at least a second contact formed on the insulation structure on a side of the second gate, and a second metal layer formed on the second contact. Next, a first capacitance between the first gate and the first metal layer is measured, and a second capacitance between the second gate and the second metal layer is measured. Finally, a resultant capacitance is obtained by deducting the second capacitance from the first capacitance.

In another embodiment of the present invention, the method to extract gate to source/drain and overlap capacitances comprises steps as above but using different second test key structure. The second test key comprises at least a second gate formed on the semiconductor substrate, at least a second gate dielectric layer formed between the semiconductor substrate and the second gate, a second spacer formed on a sidewall of the second gate, a second contact formed on the semiconductor substrate on a side of the second gate, and a second metal layer formed on the second contact.

In further another embodiment of the present invention, the method to extract gate to source/drain and overlap capacitances comprises steps as follows. First, a test key is provided. The test key comprises at least a gate elongated along gate width direction formed on a semiconductor substrate, wherein a first contact is disposed on a first end portion of the elongated gate, a first metal layer formed on the first contact, at least a gate dielectric layer formed between the semiconductor substrate and the elongated gate, a spacer formed on a sidewall of the elongated gate, a first elongated doping region formed in the semiconductor substrate on an elongated side of the elongated gate, at least a second contact formed on a second end portion of the first doping region, wherein the second end portion is far from the first end portion, a second metal layer formed on the second contact. Thereafter, a capacitance between the first metal layer and the second metal layer is measured.

In further another embodiment of the present invention, the present invention is directed to a test key used for the method of the present invention. The test key structure comprises at least a gate formed on an insulation structure in a semiconductor substrate, at least a gate dielectric layer formed between the insulation structure and the gate, a spacer formed on a sidewall of the gate, at least a first contact formed on the insulation structure on a side of the gate, and a first metal layer formed on the first contact.

In still further another embodiment of the present invention, the present invention is directed to a test key used for the method of the present invention. The test key structure comprises at least a gate formed on a semiconductor substrate, at least a gate dielectric layer formed between the semiconductor substrate and the gate, a spacer formed on a sidewall of the gate, at least a contact formed on the semiconductor substrate on a side of the gate, and a metal layer formed on the contact.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a schematic cross-sectional view of test keys to illustrate an embodiment of the method according to the present invention;

FIG. 4 is a schematic diagram illustrating a layout in an embodiment of the present invention in which each test key comprises a plurality of gates;

FIG. 5 is a schematic cross-sectional view of test keys to illustrate another embodiment of the method according to the present invention;

FIG. 6 is a schematic cross-sectional view of a test key in another aspect according to the present invention;

DETAILED DESCRIPTION

In order to obtain a pure gate to source/drain and overlap capacitances, the method according to the present invention is characterized that, by utilizing a test key having a novel structure and a reference test key, the gate to source/drain and overlap capacitances can be decoupled.

Figure 1:
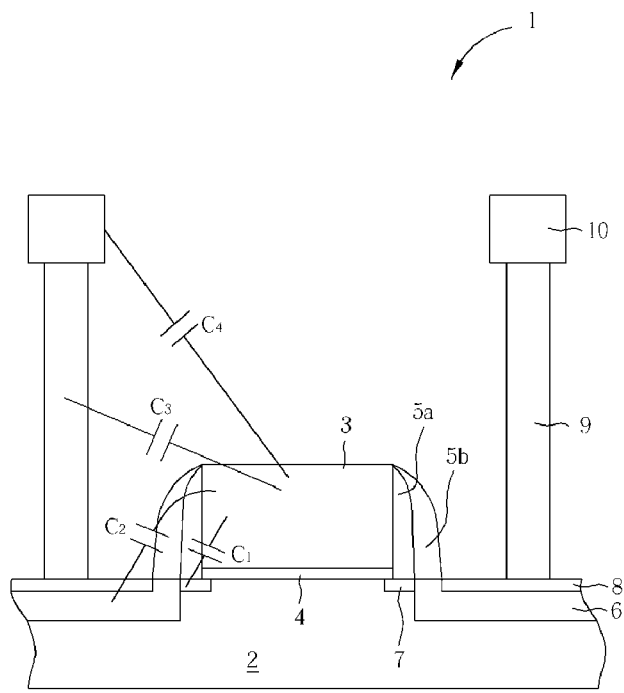
FIG. 1 is a schematic cross-sectional view of a conventional MOS structure to illustrate the capacitance existing between the gate and the source/drain, the source/drain extension, the contact, and the metal layer.
Figure 2:
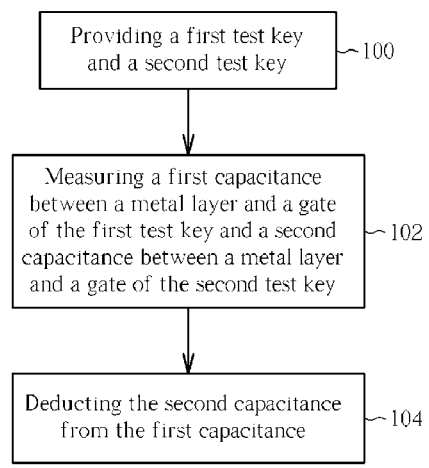
FIG. 2 shows a flow chart of steps in an embodiment according to the method of the present invention.

FIG. 2 illustrates the steps of the method of the present invention. In Step 100, a first test key and a second test key are provided. In Step 102, a first capacitance between a metal layer and a gate of the first test key and a second capacitance between a metal layer and a gate of the second test key are measured. In Step 104, the second capacitance is deducted from the first capacitance, thereby to obtain a resultant capacitance.

The first test key comprises at least a first gate, at least a first gate dielectric layer, at least a first spacer, at least a first doping region, at least a first contact and a first metal layer. The second test key comprises at least a second gate, at least a second gate dielectric layer, at least a second spacer, at least a second contact, and a second metal layer.

The first test key and the second test key are formed correspondingly in same size on a same semiconductor substrate using same processes, unless different components thereof are formed. FIG. 3 shows a cross-sectional view of the first test key 11a and the second test key 11b. In the first test key 11a, a first gate 13 is formed on a semiconductor substrate 12. The gate may comprise polysilicon, metal, silicide or a combination thereof, but not limited thereto. A first gate dielectric layer 14 is formed between the semiconductor substrate 12 and the first gate 13. The gate dielectric layer may comprise oxide, nitride, oxynitride, metal oxide or high k dielectric material, but not limited thereto. A first spacer is formed on a sidewall of the first gate 13. The spacer may comprise, for example, a single layer or a composite spacer composed of, for example, a spacer 15a and a spacer 15b, but not limited thereto. The materials forming the spacer may comprise oxide, nitride, oxynitride, silicon carbide or a combination thereof, but not limited thereto. A first doping region 16 is formed in the semiconductor substrate 12 on a side of the first gate 13. The doping region 16 may comprise, for example, a source/drain 19 and a source/drain extension 20 extending from the source/drain 19 toward the direction of a gate channel under the first gate 13 and partially overlapping with the first gate 13, but not limited thereto. The doping region 16 may be doped with an N-type dopant or a P-type dopant, by, for example, implantation, diffusion, or other useful processes. In FIG. 3, another doping region 16 comprising the source/drain 19 and the source/drain extension 20 is also formed on the opposite side of the first gate 13. A first contact 17 is formed on each source/drain 19 in an interlayer dielectric layer which is not shown in the figure. As well known to a person skilled in the art, an interlayer dielectric layer usually comprises oxide, nitride, oxynitride, carbide, low-k dielectric or other materials and is formed after completing gate structure so as to cover the whole gate structure. And the first contact 17 is formed in the interlayer dielectric layer by patterning the interlayer dielectric layer and filling a conductive material therein. In FIG. 3, a salicide layer 21 is further formed between the contact 17 and the source/drain 19 for better contact. A first metal layer 18 is formed on each first contact 17. All the metal layers 18 may be electrically connected or they may be formed in a form of a singular layer, for convenient testing. Accordingly, in the test key 11a as shown in FIG. 3, two times capacitance ($C_1+C_2+C_3+C_4$) exists. Hereinafter, $C_1$ represents the capacitance between the gate and the source/drain extension, that is, the "overlap capacitance", $C_2$ represents the capacitance between the gate and the source/drain, $C_3$ represents the capacitance between the gate and the contact, and $C_4$ represents the capacitance between the gate and the metal layer.

In the second test key 11b, a second gate 23 is formed on an insulation structure 29 in the semiconductor substrate 12. A second gate dielectric layer 24 is formed between the insulation structure 29 and the second gate 23. A second spacer is formed on a sidewall of the second gate 23. The spacer may comprise, for example, a single layer or a composite spacer composed of for example a spacer 25a and a spacer 25b, but not limited thereto. There is not a doping region in the insulation structure 29 on the side of the second gate 23. The forming of the first doping region may be performed by doping a dopant comprehensively in the semiconductor substrate 12, but doping regions will not be formed in the insulation structure 29. A second contact 27 is formed in an interlayer dielectric layer on the insulation structure 29 on two opposite sides of the second gate 23. A second metal layer 28 is formed on each second contact 27. Accordingly, in the test key 11b as shown in FIG. 3, two times capacitance ($C_3$+$C_4$) exists, and capacitance $C_1$ or $C_2$ does not exist.

The first capacitance measured between the first gate 13 and the first metal layer 18 of the first test key 11a, which may serve as a reference test key, will equal two times capacitance ($C_1$+$C_2$+$C_3$+$C_4$). The second capacitance measured between the second gate 23 and the second metal layer 28 of the second test key 11b having a novel structure will equal two times capacitance ($C_3$+$C_4$). As the second capacitance is deducted from the first capacitance, a resultant capacitance equaling two times ($C_1$+$C_2$) is obtained. Accordingly, the gate to source/drain and overlap capacitances is decoupled from the total capacitance ($C_1$+$C_2$+$C_3$+$C_4$).

The first test key 11a and the second test key 11b shown in FIG. 3 comprises two times capacitance respectively; however, the first test key may comprise only one doping region on only one side of the first gate, only one contact, and thus one metal layer, and the second test key may correspondingly comprise only one contact and thus one metal layer. As a result, the first capacitance measured between the first gate and the first metal layer of the first test key will equal capacitance ($C_1$+$C_2$+$C_3$+$C_4$). The second capacitance measured between the second gate and the second metal layer of the second test key will equal capacitance ($C_3$+$C_4$). The second capacitance is deducted from the first capacitance to obtain a resultant capacitance equaling capacitance ($C_1$+$C_2$). The gate to source/drain and overlap capacitances can be also obtained.

The method according to the present invention may further have many modifications. For example, please refer to FIG. 4, a diagram illustrating a layout in which the first and second test keys each comprise a plurality of gates to enhance electrical signal intensity and to reduce influences of the noises. The number of gates is not limited as long as the first and second test keys have the same number of gates with the same geometric features and distribution. The first test key 11a' comprises a plurality of first gates 13. The first gates 13 are formed on a semiconductor substrate 12. A first gate dielectric layer (not shown) is formed between the semiconductor substrate 12 and each first gate 13. A first spacer (not shown) is formed on a sidewall of each first gate 13. A first doping region 16 is formed in the semiconductor substrate 12 on each of two opposite sides of each first gate 13. However, the first doping region 16 can also be formed in the semiconductor substrate 12 on only one side of each first gate 13 as long as the second test key uses the same arrangement. There are a plurality of first contacts 17 formed on each first doping region 16. Similarly, the number of first contacts is not limited as long as the first and second test keys have the same number of contacts with the same geometric features and distribution. A first metal layer 18 is formed on all of the first contacts 17. A pad (PAD 1) is formed on one terminal of the first metal layer 18 for applying electric signals. All of the first gates 13 are electrically connected together and a pad (PAD 2) is electrically connected to the first gates 13 through contacts 32 and a metal layer 33 for applying electric signals. An insulation structure 22 is formed to electrically separate each set of gate and doping region.

The second test key 11b' comprises the same number of second gates 23 as the first test key 11a'. The second gates 23 are formed on an insulation structure 29 in the semiconductor substrate 12. A second gate dielectric layer (not shown) is formed between the insulation structure 29 and each second gate 23. A second spacer (not shown) is formed on a sidewall of each second gate 23. There are the same number of second contacts 27 as the first test key 11a' formed on the insulation structure on each of two opposite sides of each second gate 23. A second metal layer 28 is formed on all of the second contacts 27. A pad (PAD 3) is formed on one terminal of the second metal layer 18 for applying electric signals. All of the second gates 23 are electrically connected together and a pad (PAD 4) is electrically connected to the second gates 23 through contacts 30 and a metal layer 31 for applying electric signals.

In another embodiment according to the method of the present invention, a cross-sectional view of the first test key and the second test key provided may be illustrated by FIG. 5. In the first test key 41a, a first gate 43 is formed on a semiconductor substrate 42. A first gate dielectric layer 44 is formed between the semiconductor substrate 42 and the first gate 43. A first spacer which may comprise for example a spacer 45a and a spacer 45b is formed on a sidewall of the first gate 43. A first doping regions 46a is formed in the semiconductor substrate 42 on a side of the first gate 43. The region in the semiconductor substrate 42 on the opposite side of the first gate 43 may be not doped or may be also doped. As the embodiment shown in FIG. 5, the region is also doped to be a first doping region 46b. The doping regions 46a and 46b each may comprise a source/drain 49 and a source/drain extension 50. A first contact 47 is formed on the first doping region 46a. A first metal layer 48 is formed on the first contact 47. A salicide layer 51 may be further formed on each source/drain 49. There is not a contact formed on the doping region 46b. Accordingly, in the test key 41 a as shown in FIG. 5, one time capacitance ($C_1$+$C_2$) and one time capacitance ($C_3$+$C_4$) exist.

In the second test key 41b, a second gate 53 is formed on the semiconductor substrate 42. A second gate dielectric layer 54 is formed between the semiconductor substrate 42 and the second gate 53. A second spacer which may comprise for example a spacer 55a and a spacer 55b is formed on a sidewall of the second gate 53. A second contact 57 is formed on the semiconductor substrate 42 on a side of the second gate 53. A second metal layer 58 is formed on the second contact 57. A salicide layer 61 may be further formed between the contact 57 and the semiconductor substrate 42. The region in the semiconductor substrate 42 on the side of the first gate 53 opposite to the contact 57 may be not doped or may be also doped corresponding to the first test key 41a. As the embodiment shown in FIG. 5, the region is also doped to be a doping region 56b. The doping region 56b is doped with the same type of dopant used in the doping regions 46a and 46b and may comprise a source/drain 59 and a source/drain extension 60. A salicide layer 61 may be further formed on the source/drain 59. There is not a contact formed on the doping region 56b. The region 56a may be a region not doped, as shown in FIG. 5. Alternatively, the region 56a may be doped with a dopant of a reverse type with respect to the type of dopant in the doping region 46a, which may be shown in FIG. 6. In FIG. 6, the region 56a may further comprise a first reverse-type-doped region 68 and a second reverse-type-doped region 69. Accordingly, in the test key 41b as shown in FIG. 5 or FIG. 6, only one time capacitance ($C_3+C_4$) exists.

The first capacitance measured between the first gate 43 and the first metal layer 48 of the first test key 41a, which may serve as a reference test key, will equal one time capacitance ($C_1+C_2$) plus one time capacitance ($C_3+C_4$). The second capacitance measured between the second gate 53 and the second metal layer 58 of the second test key 41b having a novel structure will equal one time capacitance ($C_3+C_4$). As the second capacitance is deducted from the first capacitance, a resultant capacitance equaling the sum of $C_1$ and $C_2$ is obtained. Accordingly, the gate to source/drain and overlap capacitances are obtained.

Figure 7:
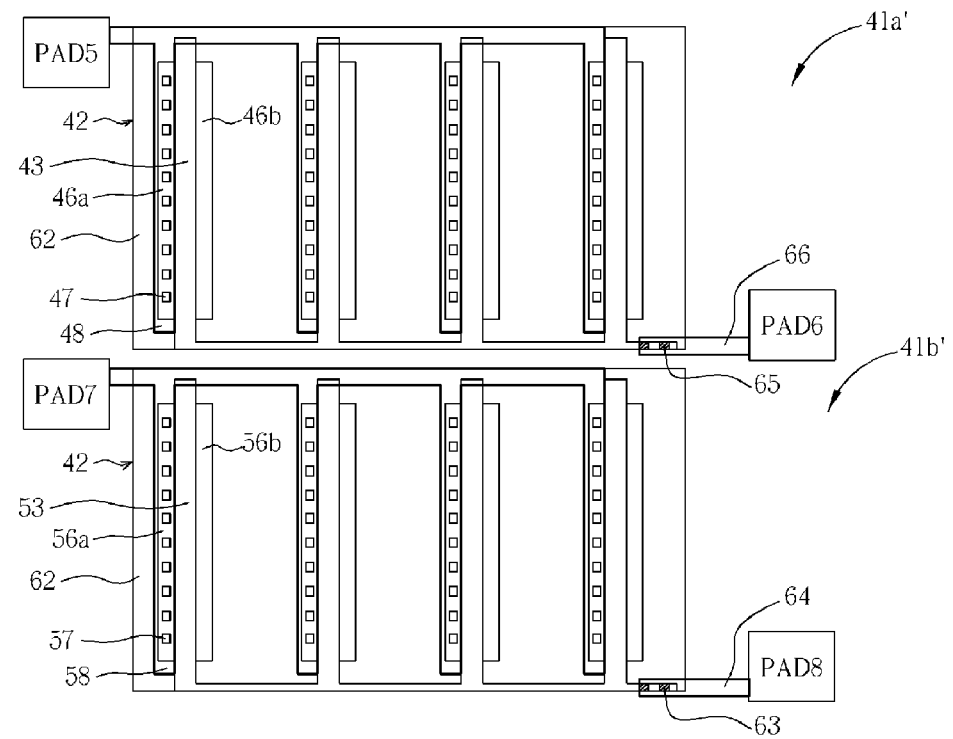
FIG. 7 is a schematic diagram illustrating a layout in another embodiment in which each test key comprises a plurality of gates.

Referring to FIG. 7, the diagram illustrates a layout when the test keys each comprise a plurality of gates having a cross-sectional view as shown in FIG. 5. The first test key 41a' comprises a plurality of first gates 43. The number of gates is not limited as long as the first and second test keys have the same number of gates with the same geometric features and distribution. The first gates 43 are formed on a semiconductor substrate 42. A first gate dielectric layer (not shown) is formed between the semiconductor substrate 42 and each first gate 43. A first spacer (not shown) is formed on a sidewall of each first gate 43. First doping regions 46a and 46b are formed in the semiconductor substrate 42 on two opposite sides of each first gate 43. There are a plurality of first contacts 47 formed on each first doping region 46a. Similarly, the number of first contacts is not limited as long as the first and second test keys have the same number of contacts with the same geometric features and distribution. A first metal layer 48 is formed on all of the first contacts 47. A pad (PAD 5) is formed on one terminal of the first metal layer 48 for applying electric signals. All of the first gates 43 are electrically connected together and a pad (PAD 6) is electrically connected to the first gates 43 through contacts 65 and a metal layer 66 for applying electric signals. An insulation structure 62 is formed to electrically separate each set of gate and doping region.

The second test key 41b' comprises the same number of second gates 53 as the first test key 41a'. The second gates 53 are formed on the semiconductor substrate 42. A second gate dielectric layer (not shown) is formed between the semiconductor substrate 42 and each second gate 53. A second spacer (not shown) is formed on a sidewall of each second gate 53. There are the same number of second contacts 57 as the first test key 41a' formed on the semiconductor substrate on one side of each second gate 53. A second metal layer 58 is formed on all of the second contacts 57. A doping region 56b is formed in the semiconductor substrate 42 on the side of each first gate 53 opposite to the contacts 57. The regions 56a are portions of the semiconductor substrate not doped. A pad (PAD 7) is formed on one terminal of the second metal layer 58 for applying electric signals. All of the second gates 53 are electrically connected together and a pad (PAD 8) is electrically connected to the second gates 53 through contacts 63 and a metal layer 64 for applying electric signals.

Figure 8:
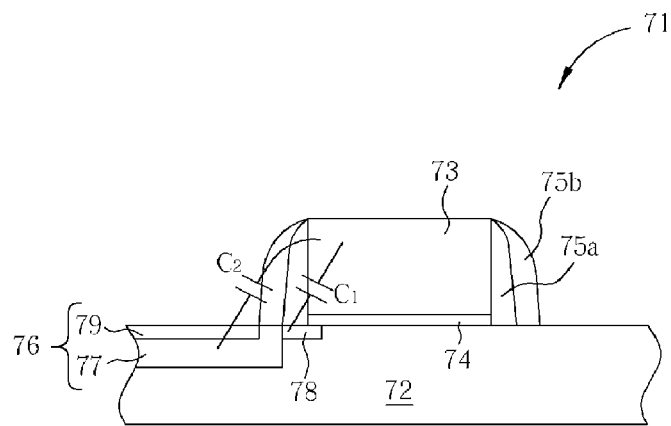
FIG. 8 is a schematic cross-sectional view of a test key to illustrate a further another embodiment of the method according to the present invention.
Figure 9:
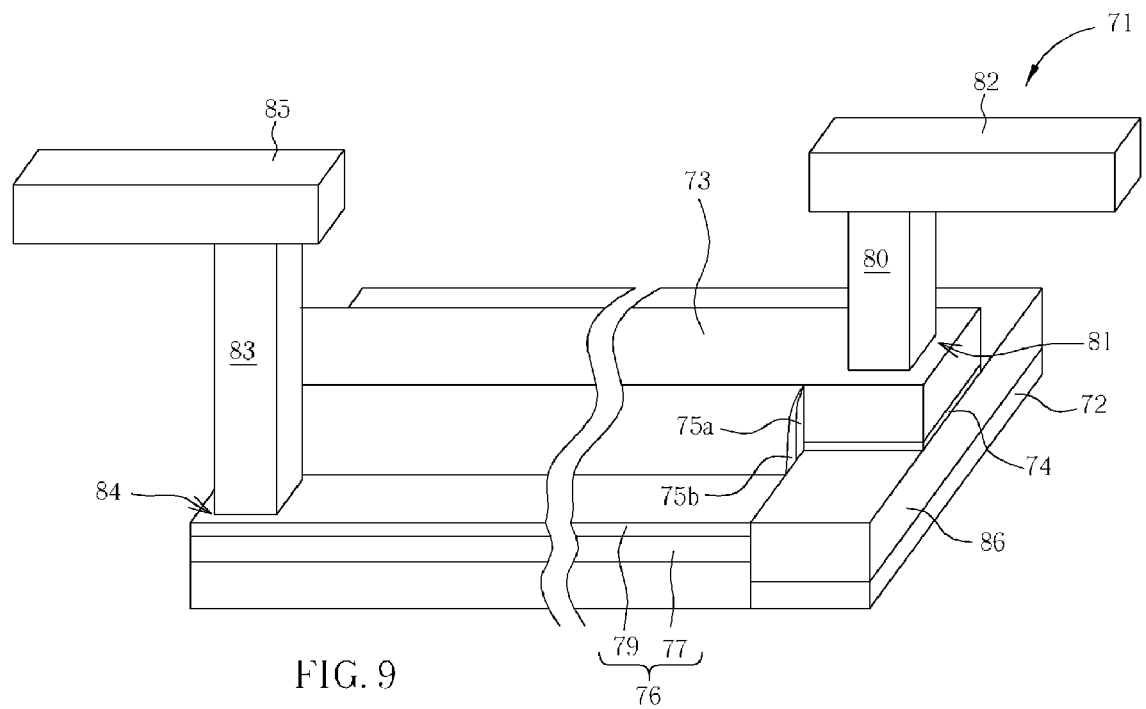
FIG. 9 is a schematic perspective view of the test key shown in FIG. 8.
Figure 10:
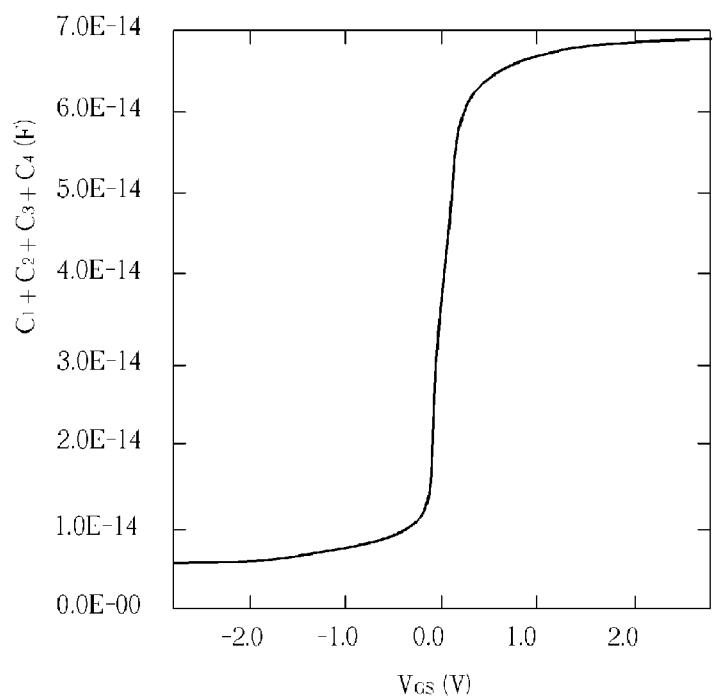
FIG. 10 is a diagram showing a plotting of overall capacitance versus gate-to-source voltage in a conventional test key.

In further another embodiment according to the method of the present invention, a test key is provided and FIG. 8 and FIG. 9 illustrates a cross-sectional view and a partial perspective view of one embodiment. In the test key 71, a gate 73 is formed on a semiconductor substrate 72. The gate 73 is in an elongated shape, such as a shape of a long strip extending along a direction of the channel width, but not limited thereto. The elongated shape may be, for example, a band in a straight, curve, winding, or bended shape. A gate dielectric layer 74 is formed between the semiconductor substrate 72 and the gate 73. A spacer which may comprise, for example, a spacer 75a and a spacer 75b is formed on a sidewall of the gate 73. A doping region 76 is formed in the semiconductor substrate 72 on only one side of the gate 73. The doping region 76 is also in a shape of a long strip correspondingly disposed along the gate 73. The doping region 76 may comprise a source/drain 77 and a source/drain extension 78, and may further comprise a salicide layer 79. A first contact 80 is formed on an end portion 81 of the gate 73. The end portion 81 overlies an isolation structure 86 formed in the semiconductor substrate 72. The term "end portion" herein means a portion of the elongated shape at or near one of the two ends of the elongated shape in the elongated direction. A first metal layer 82 is formed on the first contact 80. A second contact 83 is formed on a second end portion 84 of the doping region 76. The second end portion 84 is the end portion of the doping region 76 far from the first end portion 81 of the gate 73. A second metal layer 85 is formed on the second contact 83. Accordingly, a capacitance of $C_1+C_2$ exists. A capacitance between the first metal layer 82 and the second metal layer 85 is measured. Since only one, not a row of, second contact 83 is disposed on the end portion 84 of the doping region 76, the capacitance between the metal layer and the gate and the capacitance between the contact and the gate are negligible with respect to the gate to source and overlap capacitances between the elongated doping region and the elongated gate, the capacitance will approximately equal ($C_1+C_2$).

The test key provided in this embodiment also may have a plurality of gates instead of only one gate, or may have a few contacts disposed on the end portion of the doping region, or may comprise the same doping region, contact and metal layer formed on two opposite sides of the gate, or other alike, to enhance the electric signals for measurement. A patterned first metal layer may be formed on all of the first contacts, and a patterned second metal layer may be formed on all of the second contacts. A measurement of capacitance is performed between the first metal layer and the second metal layer.

The method and the test key of the present invention described above may be utilized in semiconductor tests for different generations, even for 0.13 µm, 0.09 µm, or sub-0.09 µm semiconductor manufacturing processes. The test key structure may be formed corresponding to a FET (field effect transistor), a FET on SOI (silicon on insulator), a FinFET (fin field effect transistor), or the like. Therefore, the gates of the test key structure may be one type of gate selected from the group consisting of types of gates of a FET, a FET on SOI, and a FinFET.

All combinations and sub-combinations of the above-described features also belong to the present invention. Those skilled in the art will readily observe that numerous modifications and alterations of the device and method may be made while retaining the teachings of the invention.

What is claimed is:

1. A method to extract gate to source/drain and overlap capacitances, comprising:
    providing a first test key and a second test key, wherein,
        the first test key comprises:
            at least a first gate formed on a semiconductor substrate,
            at least a first gate dielectric layer formed between the semiconductor substrate and the first gate,
            a first spacer formed on a sidewall of the first gate, a first doping region comprising a dopant of first type formed in the semiconductor substrate on a side of the first gate, at least a first contact formed on the first doping region, and a first metal layer formed on the first contact; and the second test key comprises:

at least a second gate formed on the semiconductor substrate, at least a second gate dielectric layer formed between the semiconductor substrate and the second gate, a second spacer formed on a sidewall of the second gate, a second contact formed on the semiconductor substrate on a side of the second gate, wherein the semiconductor substrate under the second contact is doped with a dopant of second type, and a second metal layer formed on the second contact;

measuring a first capacitance between the first gate and the first metal layer;

measuring a second capacitance between the second gate and the second metal layer; and deducting the second capacitance from the first capacitance to obtain a resultant capacitance.

2. The method of claim 1, wherein the first doping region comprises a first source/drain and a first source/drain extension extending from the first source/drain toward a gate channel under the first gate and overlapping with the first gate, and the resultant capacitance comprises capacitance between the first gate and the first source/drain and capacitance between the first gate and the first source/drain extension.

3. The method of claim 1, wherein, a first salicide layer is formed between the first contact and the first doping region, and a second salicide layer is formed between the second contact and the semiconductor substrate.

4. A method to extract gate to source/drain and overlap capacitances, comprising:

providing a test key comprising:

at least an elongated gate elongated along a direction of a gate width formed on a semiconductor substrate, and having a first end portion and a second end portion opposite to the first end portion in the direction of the gate width, wherein the first end portion overlies an isolation structure formed in the semiconductor substrate and a first contact is disposed on a top of the first end portion of the elongated gate, a first metal layer formed on the first contact, at least a gate dielectric layer formed between the semiconductor substrate and the elongated gate, a spacer formed on a sidewall of the elongated gate, a first elongated doping region formed in the semiconductor substrate on an elongated side of the elongated gate and having a third end portion and a fourth end portion opposite to the third end portion in the direction of the gate width, wherein the third end portion is adjacent to the first end portion of the elongated gate and the fourth end portion is adjacent to the second end portion of the elongated gate, at least a second contact formed on a top of the fourth end portion of the first elongated doping region, and a second metal layer formed on the second contact; and measuring a capacitance between the first metal layer and the second metal layer.

5. The method to extract gate to source/drain and overlap capacitances of claim 4, wherein the test key further comprises:

a second elongated doping region formed in the semiconductor substrate on another elongated side of the elongated gate and having a fifth end portion and a sixth end portion opposite to the fifth end portion in the direction of the gate width, wherein the fifth end portion is adjacent to the first end portion of the elongated gate and the sixth end portion is adjacent to the second end portion of the elongated gate, at least a third contact formed on the sixth end portion of the second elongated doping region, and a third metal layer formed on the third contact and electrically connected to the second metal layer.

* * * * *